United States Patent
Okabayashi et al.

(10) Patent No.: US 9,628,038 B2
(45) Date of Patent: Apr. 18, 2017

(54) AUDIO SIGNAL PROCESSING SYSTEM

(71) Applicant: Yamaha Corporation, Hamamatsu-Shi, Shizuoka-Ken (JP)

(72) Inventors: Masaaki Okabayashi, Hamamatsu (JP); Hideki Hagiwara, Hamamatsu (JP); Masaru Aiso, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 14/481,174

(22) Filed: Sep. 9, 2014

(65) Prior Publication Data

US 2014/0376748 A1 Dec. 25, 2014

Related U.S. Application Data

(63) Continuation of application No. PCT/JP2013/055395, filed on Feb. 28, 2013.

(30) Foreign Application Priority Data

Mar. 9, 2012 (JP) .................................. 2012-052636

(51) Int. Cl.
*H03M 1/18* (2006.01)
*H03G 3/20* (2006.01)
(Continued)

(52) U.S. Cl.
CPC ................. *H03G 3/20* (2013.01); *H03G 3/04* (2013.01); *H03G 3/3005* (2013.01); *H03M 1/18* (2013.01);
(Continued)

(58) Field of Classification Search
CPC .......... H03G 3/3005; H03G 3/20; H03G 3/04; H03M 1/18; H04R 29/007; H04R 29/008;
(Continued)

(56) References Cited

U.S. PATENT DOCUMENTS 5,548,592 A 8/1996 Komarek et al.
8,265,305 B2 * 9/2012 Aoki ..................... H04H 60/04
381/119
(Continued)

FOREIGN PATENT DOCUMENTS

EP 1 482 664 A2 12/2004
EP 1 841 137 A2 10/2007
(Continued)

OTHER PUBLICATIONS

International Search Report mailed May 28, 2013, for PCT Application No. PCT/JP2013/055395, with English translation, three pages.
(Continued)

*Primary Examiner* — Melur Ramakrishnaiah
(74) *Attorney, Agent, or Firm* — Morrison & Foerster LLP

(57) ABSTRACT

While level of the inputted analog signal is adjusted according to a set analog gain value and then analog-digital converted and outputted, when an automatic compensation is on and a difference of the analog gain value and a target value is compensated by level adjustment in a digital amplifier, the analog gain value is displayed by a gain knob, and in response to an operation to turn on the automatic compensation, a present value of the analog gain value at that time is displayed as a target gain value by a mark near the analog gain value, and in response to an operation to turn off the automatic compensation, display of the target gain value is erased.

20 Claims, 10 Drawing Sheets

(51) Int. Cl.
*H03G 3/30* (2006.01)
*H03G 3/04* (2006.01)
*H04R 29/00* (2006.01)
*H04H 60/04* (2008.01)
*H04R 3/00* (2006.01)

(52) U.S. Cl.
CPC ..... *H04R 29/007* (2013.01); *H03G 2201/103* (2013.01); *H04H 60/04* (2013.01); *H04R 3/00* (2013.01); *H04R 29/008* (2013.01); *H04R 2420/01* (2013.01); *H04R 2430/01* (2013.01)

(58) Field of Classification Search
CPC .. H04R 2420/01; H04R 3/00; H04R 2430/01; H04H 60/04
USPC ............ 381/120, 119, 79–81, 102–109, 123; 700/20, 94
See application file for complete search history.

(56) References Cited

U.S. PATENT DOCUMENTS

| | | |
|---|---|---|
| RE46,205 E | 11/2016 | Aoki |
| 2003/0123480 A1 | 7/2003 | Maeda |
| 2007/0025568 A1 | 2/2007 | Aiso et al. |
| 2007/0142944 A1 | 6/2007 | Goldberg et al. |
| 2007/0160237 A1 | 7/2007 | Hibino et al. |
| 2007/0230462 A1 | 10/2007 | Nakayama |
| 2011/0019842 A1* | 1/2011 | Aoki ...................... H04H 60/04 381/119 |
| 2014/0376748 A1 | 12/2014 | Okabayashi et al. |

FOREIGN PATENT DOCUMENTS

| | | |
|---|---|---|
| EP | 1 901 488 A2 | 3/2008 |
| JP | 2002-312112 A | 10/2002 |
| JP | 2003-099038 A | 4/2003 |
| JP | 2007-043249 A | 2/2007 |
| JP | 2007-295551 A | 11/2007 |
| JP | 4052072 B2 | 12/2007 |
| JP | 2008-083625 A | 4/2008 |
| JP | 2011-029899 A | 2/2011 |
| WO | WO-2013/133121 A1 | 9/2013 |

OTHER PUBLICATIONS

International Preliminary Report on Patentability for PCT Application No. PCT/JP2013/055395, dated Sep. 9, 2014, English Translation, five pages.
Chinese Search Report dated Apr. 12, 2016, for CN Application No. 201380013300.7, with English translation, four pages.
Notification of the first Office Action dated Apr. 12, 2016, for CN Application No. 201380013300.7, with English translation, ten pages.
Yamaha Corporation. (2014). CL Series | Mixers | Products | Yamaha — Features, located at: <http://www.yamahaproaudio.com/global/en/products/mixers/cl/features.jsp>, last visited Sep. 10, 2014, eleven pages.
European Communication mailed May 12, 2016, for EP Application No. 10170240.5, five pages.
European Extended Search Report mailed Aug. 29, 2012, for EP Application No. 10170240.5, six pages.
Non-Final Office Action mailed Nov. 30, 2015, for U.S. Appl. No. 14/483,119, filed Sep. 10, 2014, 27 pages.
Notice of Allowance mailed Jun. 30, 2016, for U.S. Appl. No. 14/483,119, filed Sep. 10, 2014, seven pages.

* cited by examiner

US 9,628,038 B2

AUDIO SIGNAL PROCESSING SYSTEM

CROSS-REFERENCE TO RELATED APPLICATIONS

This application is a continuation of International Application No. PCT/JP2013/055395, filed Feb. 28, 2013, which claims the priority benefit of Japanese Patent Application No. 2012-052636 filed Mar. 9, 2012, the contents of which are hereby incorporated by reference in their entireties for all intended purposes.

TECHNICAL FIELD

The invention relates to an audio signal processing system having an automatic compensation function of gain of an input signal.

BACKGROUND ART

It has been conventionally known an audio signal processing system having an automatic compensation function of an input signal as described in PTL1.

In the system described in PTL1, in a signal input device, an input port inputting an analog audio signal is provided with an analog amplifier for adjusting a level of an input signal, an AD converter which analog-digital converts an output of the analog amplifier, a compensation unit with a digital amplifier adjusting a level of an output signal of the AD converter, and a switch unit selecting either of the output signal of the AD converter and an output signal of the compensation unit, and a signal selected by the switch unit is outputted to a subsequent stage.

Further, on a console, a first control for accepting an on/off operation of automatic compensation and a second control for accepting a change operation of gain of the analog amplifier are provided corresponding to the input port.

Then, when a user operates the first control, the signal input device switches on and off of automatic compensation of the corresponding input port. Then, the switch unit selects the output signal of the compensation unit when the automatic compensation is on, or selects the output signal of the AD converter when it is off.

Further, when the user operates the second control, the signal input device changes gain of the analog amplifier at the corresponding input port according to the operation amount thereof. Further, when automatic compensation is on, gain of the compensation unit is changed by an amount that cancels out the change in gain of the analog amplifier.

Therefore, when automatic compensation is off, the signal input device outputs to the subsequent stage a signal adjusted in level according to gain set by operating the second control. On the other hand, when automatic compensation is on, the amount of change is canceled out by the compensation unit even when setting of gain is changed by operation of the second control, and thus a signal adjusted in level by substantially constant gain is outputted to the subsequent stage even when the second control is operated.

CITATION LIST

Patent Literature

{PTL1} JP 2011-29899

SUMMARY OF INVENTION

Technical Problem

For example, when it is desired to adjust gain of the analog amplifier according to an amplitude of an input signal and input a signal at a level that allows maximum utilization of a range to the AD converter, the above-described automatic compensation function is able to prevent the gain adjustment from affecting a signal level of the subsequent stage. Therefore, gain of the analog amplifier can be set to an appropriate value without resetting parameters of the subsequent stage, which can contribute to improvement in sound quality.

Incidentally, in above-described PTL1, there is no particular description on how the operating state of the input port is displayed. On the other hand, the parameters operated and set by the user for level adjustment of signal are on/off of automatic compensation and gain of the analog amplifier, but simply displaying these values would not be a display that is easy to understand.

For example, in a state where the automatic compensation is off, level of a signal outputted to the subsequent stage depends on gain of the analog amplifier. Therefore, based on a current value of gain of the analog amplifier, the level of the output signal can be comprehended to a certain extent and can be compared with another port.

However, in a state where the automatic compensation is on, the level of a signal actually outputted to the subsequent stage is constant irrespective of gain of the analog amplifier, and level adjustment by the compensation unit is also reflected. Therefore, even when the current value of gain of the analog amplifier can be confirmed, it can be said that it is insufficient as information for comprehending the level of the output signal.

The invention has been made based on such a background, and it is an object thereof to make level of a signal to be outputted from an input port to a subsequent stage be easily understandable by a user in the audio signal processing system having an automatic compensation function.

Solution to Problem

To attain the above object, an audio signal processing system of the invention includes in one device or in a distributed manner in plural devices: a level adjuster including an analog amplifier adjusting a level of an inputted analog signal according to a set analog gain value, an AD converter converting an analog signal outputted from the analog amplifier into a digital signal, a digital amplifier adjusting a level of a digital signal outputted by the AD converter according to a set digital gain value, and a selector selecting one of an output of the AD converter and an output of the digital amplifier as a signal to be outputted to a subsequent stage; a gain operation accepter accepting a change operation of the analog gain value; a compensation operation accepter accepting an on/off operation of automatic compensation in the level adjuster; an analog gain display displaying a current value of the analog gain value; and a controller which (1) according to an operation to turn on the automatic compensation, displays a current value of the analog gain value at this point as a target gain value in a vicinity of the analog gain display and causes the selector to select an output of the digital amplifier, (2) according to the change operation of the analog gain value while the automatic compensation is turned on, sets the digital gain value to a value which cancels out a difference between the target gain value and the analog gain value, and (3) according to an operation to turn off the automatic compensation, erases the display of the target gain value and causes the selector to select an output of the AD converter.

Advantageous Effects of Invention

An audio signal processing system of the invention as described above is able to make level of a signal to be outputted from an input port to a subsequent stage be easily understandable by a user in an audio signal processing system having an automatic compensation function.

DESCRIPTION OF EMBODIMENTS

Hereinafter, embodiments for carrying out the invention will be described specifically based on drawings.

Figure 1:
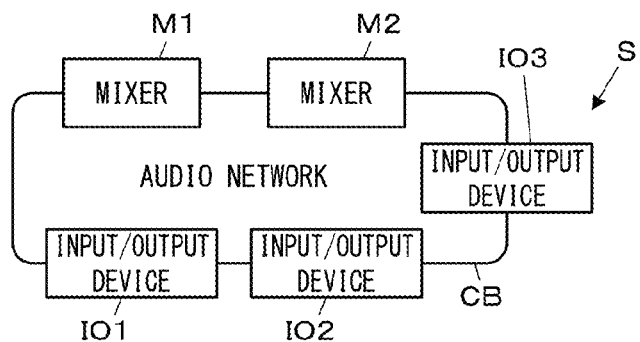
FIG. 1 is a block diagram illustrating a structure of an audio network system which is an embodiment of an audio signal processing system of the invention.

First, FIG. 1 illustrates a structure of an audio network system which is an embodiment of an audio signal processing system of the invention.

As illustrated in this diagram, the audio network system S is constituted such that mixers M1, M2 and input/output devices IO1 to IO3 (when it is unnecessary to specify an individual, they are referred to as "mixer M" and "input/output device IO", respectively), each of which is a communication node, are connected in a loop form by a communication cable CB. Further, arbitrary one of the communication cable used for the connection in a loop form may be omitted to connect the devices in a cascade form having end portions.

In any case, the respective devices constituting the audio network system S can form one data transmission path in a ring form passing through all the devices by the communication cable CB. Then, the respective devices can perform transmission/reception of data to/from an arbitrary node on the transmission path by transmitting a transmission frame for data transmission through this transmission path in a manner of circulating at constant cycles, writing data desired to be transmitted to another node to this transmission frame and reading data written by another node to this transmission frame. Data which can be transmitted or received here include at least digital waveform data of plural channels, which are audio signals, and control data for a notifying information or requesting an operation (for details, for example, see JP 2007-259347 A). A network performing such data transmission is called here an "audio network".

Further, each input/output device IO is a device having an input module inputting an audio signal from the outside to the audio network system S and/or an output module outputting an audio signal to the outside from the audio network system S. However, the number of input ports and output ports and other functions may be different in each device.

Each mixer M is a device performing various signal processings such as mixing, equalizing, adding an effect, and/or the like on audio signals of plural channels, which are inputted from each input/output device IO and transmitted via the audio network. Further, results of a signal processing can be transmitted to an input/output device IO via the audio network and outputted to the outside from this input/output device IO. Further, in the example described here, the mixer itself includes the above-described input module and output module. Therefore, this mixer M can operate as one digital audio mixer capable of inputting or outputting an audio signal even when it is a single device which is not connected to the audio network.

Further, it is conceivable that, for example, a system having two mixers such as the above described system can be used for applications such that one mixer performs mixing of sounds to be heard by a performer on a stage, and another mixer performs mixing of sounds to be heard by an audience in seats.

Figure 2:
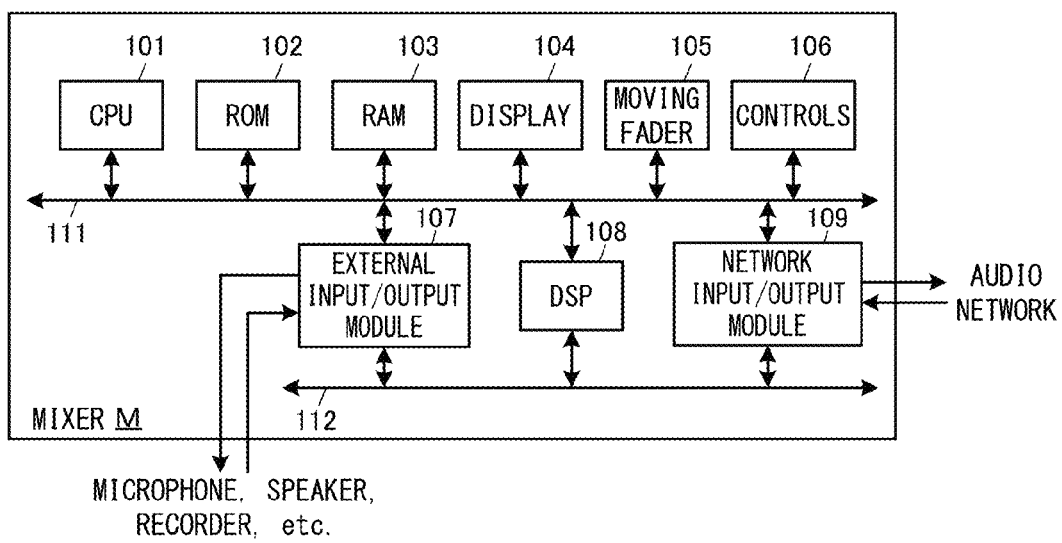
FIG. 2 is a diagram illustrating a hardware structure of a mixer illustrated in FIG. 1.

Next, FIG. 2 illustrates a hardware structure of the mixer M.

As illustrated in FIG. 2, the mixer M has a CPU 101, a ROM 102, a RAM 103, a display 104, a moving fader 105, controls 106, an external input/output module 107, a DSP (digital signal processor) 108, and a network input/output module 109, which are connected by a system bus 111. Further, three blocks of external input/output module 107, DSP 108, and network input/output module 109 are connected also to an audio bus 112 for transmitting digital waveform data of plural channels.

The CPU 101 is a controller which entirely controls operation of the mixer M, and executes a required control program stored in the ROM 102 to realize various control functions, including ones which will be described later.

The ROM 102 is a rewritable non-volatile storage storing a control program executed by the CPU 101 as well as data which should be retained after the power is turned off.

The RAM 103 is a storage temporarily storing data and is also used as a work memory of the CPU 101.

The display 104 is a display displaying various information according to control by the CPU 101, and can be constituted of, for example, a liquid crystal display (LCD) or a light emitting diode (LED).

The moving fader 105 is a slider control having a driver driving a knob and can move the knob to an arbitrary position according to control by the CPU 101.

The controls 106 are for accepting an operation on the mixer M, and can be constituted of various keys and buttons, a rotary encoder, a knob, a slider, and the like. The mixer M is provided with controls for accepting a setting operation of parameters of not only the mixer M itself but also the input/output device IO. However, these controls need not necessarily be one having a physical entity, and includes also controls for operating a knob, a button, and so on displayed on the screen by using a touch panel.

The external input/output module 107 is an interface having: an input module which inputs an analog audio signal directly (without intervention of the audio network) from the outside of the audio network system S, analog-digital converts the inputted audio signal, and then supplies the audio signal to other blocks via the audio bus 112; an output module which DA converts a digital audio signal (digital waveform data) supplied from other blocks via the audio bus 112 and outputs the audio signal directly to the outside; and a digital input/output module which inputs/outputs a digital audio signal between the outside and the audio bus 112. Both input and output can be performed via plural ports. Among them, ones related to characteristics of the embodiment is the analog input module, and details of its structure will be described later.

The DSP 108 is a signal processor performing various processings such as mixing, equalizing, adding an effect, and so on to waveform data obtained from other blocks via the audio bus 112 at a timing based on a word clock. The waveform data to which such processing is performed is outputted to other blocks via the audio bus 112.

The network input/output module 109 has a function to perform communication via the audio network, and performs transmission of waveform data and control data to the audio network (writing to the transmission frame), and reception of waveform data and control data from the audio network (reading from the transmission frame) in addition to transmission/reception control of the above-described transmission frame.

Here, when transmission of waveform data of the plural channels is performed, in the network input/output module 109, transmission ports of the plural channels regarding the transmission are formed, and waveform data of plural channels supplied to the transmission ports of the plural channels from another block are transmitted via the audio network. Further, when the waveform data of plural channels are received, reception ports of the plural channels regarding the reception are formed, and waveform data of plural channels received via the audio network are supplied to other blocks via the reception ports of the plural channels.

Note that the waveform data received by the network input/output module 109 from another node via the audio network are supplied to other blocks via the audio bus 121 from the reception ports, and waveform data supplied from another block to the transmission ports via the audio bus 121 are transmitted from the network input/output module 109 to another node via the audio network. Therefore, the audio signal inputted to the external input/output module 107 can be supplied to the network input/output module 109 via the audio bus 112, and then transmitted to another node via the audio network. Conversely, waveform data received from another node via the audio network can be supplied to the external input/output module 107 via the audio bus and then outputted to the outside. Of course, signal processing by the DSP 108 can be performed therebetween.

Figure 3:
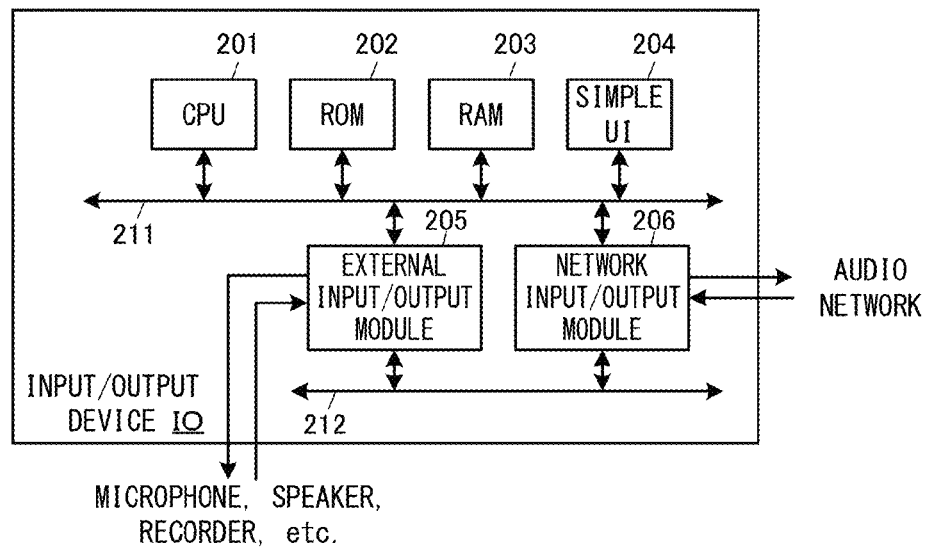
FIG. 3 is a diagram illustrating a hardware structure of an input/output device illustrated in FIG. 1.

Next, FIG. 3 illustrates a hardware structure of the input/output device IO.

As illustrated in FIG. 3, the input/output device IO includes a CPU 201, a ROM 202, a RAM 203, a simple UI (user interface) 204, an external input/output module 205, and a network input/output module 206, and these are connected via a system bus 211. Further, the external input/output module 205 and the network input/output module 206 are connected also to the audio bus 212 for transmitting digital waveform data.

The CPU 201 is a controller which entirely controls operation of the input/output device IO, and executes a required control program stored in the ROM 202 to realize various control functions, including ones which will be described later.

The ROM 202 is a rewritable non-volatile storage storing a control program executed by the CPU 201 as well as data which should be retained after the power is turned off.

The RAM 203 is a storage temporarily storing data and is also used as a work memory of the CPU 201.

The simple UI 204 is constituted of small LCDs and LEDs, a small number of buttons, and so on, performs a simple display regarding an operating state of the input/output device IO, and accepts a simple operation such as turning on/off the power. In the input/output device IO, a complicated operation such as parameter setting is accepted by using a UI of an external apparatus such as the mixer M, and the CPU 201 performs necessary setting according to a request from the external apparatus. Therefore, the UI provided in the input/output device IO may be a simple one.

Functions of the external input/output module 205 and the network input/output module 206 are the same as those of the external input/output module 107 and the network input/output module 109 of the mixer M.

Figure 4:
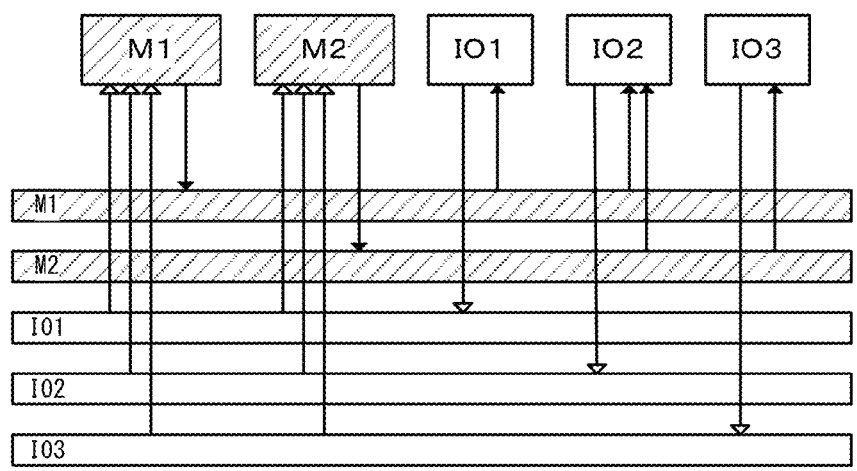
FIG. 4 is a diagram schematically illustrating detail of reading and writing of waveform data from/to a transmission frame performed by respective devices constituting an audio network system S.

Next, FIG. 4 schematically illustrates detail of reading and writing of waveform data from/to the transmission frame performed by the respective devices constituting the audio network system S.

Five boxes on the upper side of this diagram are five devices, and what part of a waveform data area of a transmission frame data are read from and what part data are written to by each device are indicated here by two types of arrows.

Further, five bands illustrated on the lower side of the diagram each represent a waveform data area corresponding to a waveform transmission channel assigned to each device in a waveform data area of the transmission frame circulating the audio network system S (the reference signs of assign target devices are illustrated on a left end). Plural waveform transmission channels assigned here are correlated one to one with plural transmission ports of the network input/output module, and waveform data supplied to each of the transmission ports is transmitted by using one corresponding waveform transmission channel. Note that a spread in a lateral direction of each band in FIG. 4 is equivalent to range of circulation of the transmission frame.

Then, an arrow extending from an upper side box representing a device in the diagram to a band representing a waveform data area indicates that transmission of waveform data is performed by this device writing waveform data to this area, and an arrow extending from a band representing a waveform data area to a box representing a device indicates that reception of waveform data is performed by this device reading waveform data from this area. Here, writing of desired waveform data to the transmission frame corresponds to "transmission of waveform data", and reading of desired waveform data from the transmission frame corresponds to "reception of waveform data".

Further, regarding the types of arrows, an arrow with a white tip indicates reading/writing of waveform data to be subjected to signal processing by the mixer M1 or M2. An arrow with a dark tip indicates reading/writing of waveform data to be outputted to the outside.

Note that the reading and writing illustrated in the diagram are examples, and depending on the settings in each device, there may be cases where one or both of the reading and writing of waveform data is or are not performed, or other reading and writing is further performed. Note that direct input and output of audio signals from each device from/to the outside are not illustrated.

In the example illustrated in FIG. 4, first, the input/output devices IO1 to IO3 respectively convert an audio signal inputted from the outside into digital waveform data and write them into the transmission frame. Then, the mixers M1 and M2 read the written waveform data, performs signal processings thereon, and write the resultant waveform data to the transmission frame. Thereafter, the input/output devices IO1 to IO3 read the written waveform data, converts them into analog audio signals, and outputs them to the outside.

In the example of FIG. 4, the processing results by the mixer M1 are outputted by the input/output devices IO1 and IO2 and the processing results by the mixer M2 are outputted by the input/output devices IO2 and IO3, but they are not limited as such.

Figure 5:
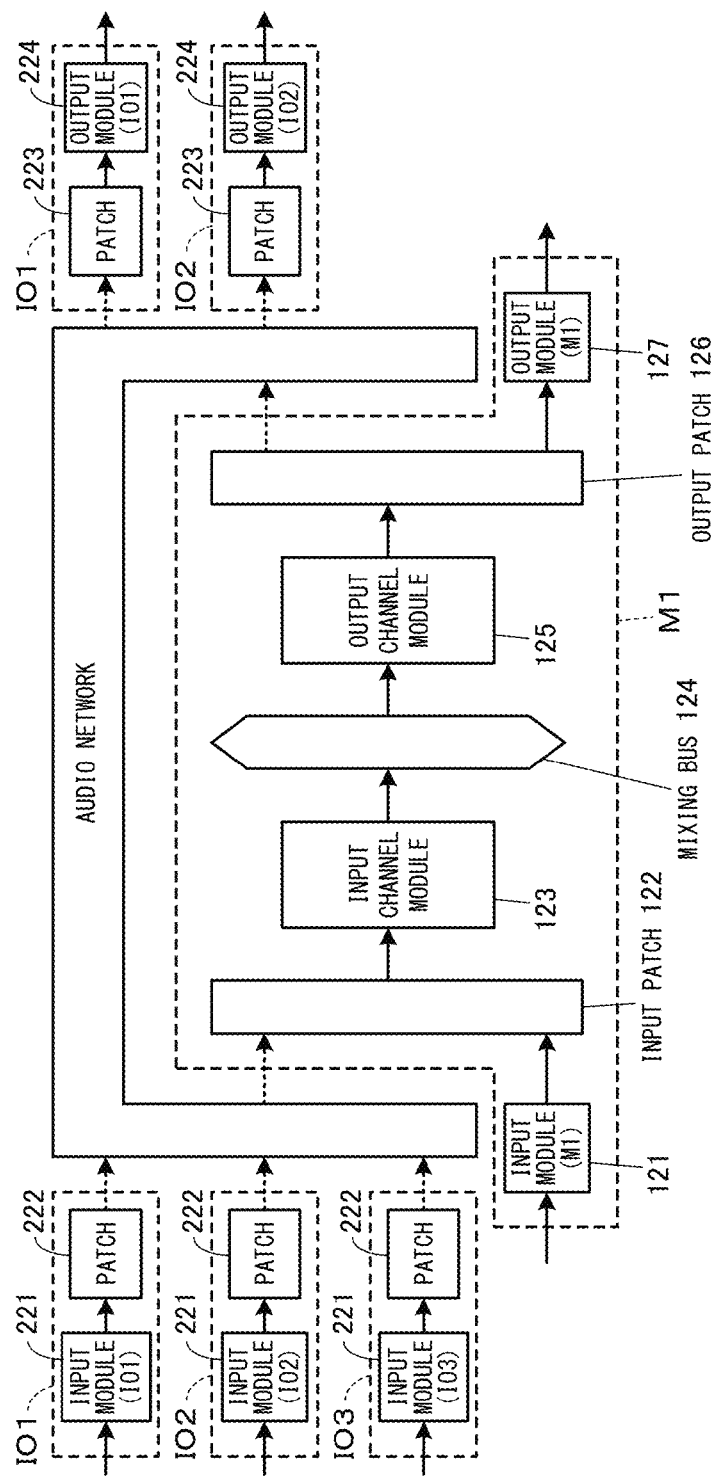
FIG. 5 is a diagram illustrating a function realized by operations of the respective devices constituting the audio network system when the reading and writing illustrated in FIG. 4 are performed, by focusing attention on a supply source and a destination of waveform data processed by the mixer M1.

Next, FIG. 5 illustrates a function realized by operations of the respective devices constituting the audio network system S when the reading and writing illustrated in FIG. 4 are performed, by focusing attention on supply sources and output destinations of waveform data processed by the mixer M1.

As illustrated in FIG. 5, an input module 221 and a patch 222 participate in supplying the audio network with waveform data inputted to each of the input/output devices IO1 to IO3 from the outside. Note that also the network input/output module 206 participates in actual writing of waveform data to the transmission frame, but it is omitted from illustration in FIG. 5.

The input module 221 among them is a module responsible for input of signal in the external input/output module 205 illustrated in FIG. 3, and includes plural analog input ports accepting inputs of analog audio signals as well as plural digital input ports and digital output ports performing input and output of digital audio signals. By connecting one desired input port to one transmission port in the patch 222, waveform data outputted by this input port can be transmitted via the audio network.

Figure 6:
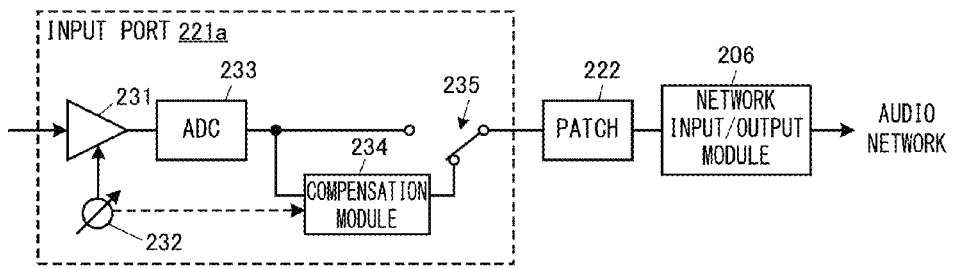
FIG. 6 is a diagram illustrating a structure of analog ports which the input/output device has.

Among them, ones related to characteristics of the embodiment are the input ports accepting inputs of analog audio signals, and thus FIG. 6 illustrates a structure of the input port accepting input of an analog audio signal (hereinafter, a simply mentioned "input port" refers to an analog input port).

As illustrated in FIG. 6, an input port 221a includes an analog amplifier 231, a gain adjusting module 232, an ADC (analog/digital converter) 233, a compensation module 234, and a switch 235.

Among them, the analog amplifier 231 adjusts level of an inputted analog audio signal according to an analog gain value set by the gain adjusting module 232.

The gain adjusting module 232 sets an analog gain value to the analog amplifier 231 and also sets a digital gain value to the compensation module 234, according to values of predetermined parameters which will be described later.

The ADC 233 analog-digital converts an inputted analog audio signal and outputs resultant digital waveform data.

The compensation module 234 is a digital amplifier and adjusts the signal level of digital waveform data outputted by the ADC 233 according to the digital gain value set by the gain adjusting module 232.

The switch 235 is a selector selecting either of an output of the ADC 233 and an output of the compensation unit 234 as a signal to be outputted by the input port 221a to the subsequent stage.

Here, in the input/output device IO, it is possible to set on/off of an automatic compensation function to absorb a change in analog gain value in the analog amplifier 231 by gain adjustment in the compensation module 234 for each of the input ports 221a. Then, the switch 235 selects an output of the compensation module 234 in which a change in gain is absorbed when the automatic compensation function is on, or selects an output of the ADC 233 in which a change in analog gain value is reflected when it is off.

Here, in the input port 221a, depending on the level of the input signal, when it is supplied as it is to the ADC 233, it may be saturated, or conversely become waveform data of low resolution due to a too low level. Accordingly, it is preferred to perform level adjustment of the input signal by the analog amplifier 231 so that it has approximately the same amplitude as the dynamic range of the ADC 233.

However, when gain of the analog amplifier 231 is changed, level of a signal outputted to a subsequent stage also changes, and balance with other signals become disordered when a mixing process in the mixer M is performed. Accordingly, when the gain of the analog amplifier 231 is changed, this automatic compensation function performs gain level adjustment to cancel out the amount of the change in the compensation module 234 after the analog-digital conversion, so that the signal level in the subsequent stage is not affected.

By utilizing this function, gain of the analog amplifier 232 can be adjusted without minding influence to the subsequent stage, and can be set to a value for realizing high-quality analog-digital conversion in the ADC 233.

Note that when the automatic compensation function is on for the input port 221a, the gain adjusting module 232 sets the digital gain value to be set to the compensation module 234 so that it cancels out difference between the analog gain value set to the analog amplifier 231 and a predetermined target value. When the automatic compensation function is off, an output of the compensation module 234 does not affect the subsequent stage, and thus it can be any value. Further, as this target value, an analog gain value at a point when the automatic compensation function is turned on is used. Therefore, at a point when the automatic compensation function is turned on, the digital gain value is set at 0 dB (decibel).

The input port 221a as above is a level adjuster, and by the input port 221a, the analog audio signal inputted from a corresponding input terminal can be adjusted in level by the analog amplifier 231 and supplied as a digital audio signal to the subsequent stage. Further, when the automatic compensation function is on, in addition, the effective gain of the entire port does not change even when gain of the analog amplifier 231 is adjusted.

Note that an output of the input port 221*a* is supplied to the network input/output module 206 via the patch 222, and the network input/output module 206 writes it to the transmission frame and transmits it to the audio network.

The patch 222 under the control of the CPU 201 supplies waveform data supplied from a desired input port 221*a* to each transmission port of the network input/output module 206 of the input/output device IO via the audio bus 212 according to correspondence set by the user. Here, the plural transmission ports of the input/output device IO are correlated one to one with plural signal transmission channels assigned to this input/output device IO, and waveform data supplied to each transmission port are written by the network input/output module 206 to the signal transmission channel corresponding to this transmission port of the transmission frame. Note that in the input/output device IO illustrated in FIG. 3, this input patch 222 is embodied as a waveform data supply function to the network input/output module 206 from the analog input/output module 205 by the audio bus 212.

Thus, the input port and the signal transmission channel are correlated by setting of the patch 222, and in this setting, an individual signal transmission channel may be presented to the user to allow patch setting from the input port to the signal transmission channel, or the signal transmission channel may be hidden from the user to allow only patch setting from the input port to the input channel and assignment of signal transmission channel needed for this patch setting (and a wire to the corresponding transmission port) may be performed automatically by the CPU 201. The same applies to the patch 223, the input patch 122, and the output patch 126 which will be described below.

Referring back to the description of FIG. 5, as functions related to audio signal processing, the mixer M1 processing waveform data transmitted through the above process includes functions of an input module 121, an input patch 122, an input channel module 123, a mixing bus 124, an output channel module 125, an output patch 126, and an output module 127. In the mixer M illustrated in FIG. 2, the input module 121 and the output module 127 are embodied as the external input/output module 107, the input channel module 123, the mixing bus 124, and the output channel module 125 are embodied as the DSP 108, the input patch 122 and the output patch 126 are embodied as the waveform data transmission function between the blocks by the audio bus 112. Further, wires from the audio network to the input patch 122 and wires from the output patch 126 to the audio network are both embodied as the network input/output module 109.

The input module 121 is similar to the input module 221 of the input/output device IO, and includes plural analog input ports accepting inputs of analog audio signals and plural digital input ports inputting digital audio signals.

Figure 7:
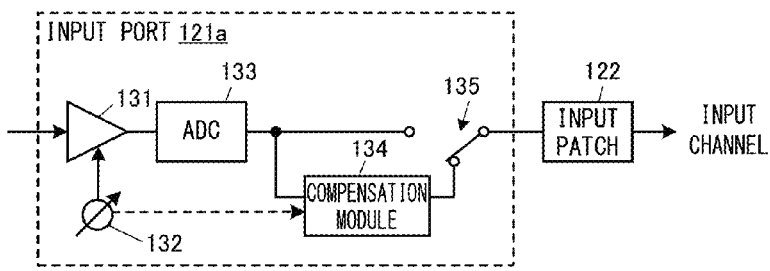
FIG. 7 is a diagram illustrating a structure of analog ports which the mixer has.

FIG. 7 illustrates a structure of an input port 121*a* accepting inputs of an analog audio signal in the input module 121, which has an analog amplifier 131, a gain adjusting module 132, an ADC (analog/digital converter) 133, a compensation module 134, and a switch 135, and they each have the same function as the structure of the same name in the input port 221*a* illustrated in FIG. 6. Therefore, the function of the entire input port 121*a* is the same as that of the input port 221*a*.

However, it is different from the input port 221*a* in that the output signal is supplied to the input channel of the input channel module 123 via the input patch 122.

When plural signal transmission channels are set as reception channels to the network input/output module 109 by the CPU 101 of the mixer M, plural reception ports are formed in the network input/output module 109 corresponding to the plural reception channels. Then, the network input/output module 109 receives plural waveform data from areas of the set plural reception channels of the transmission frame, and the received plural waveform data are outputted to the input patch 122 from the plural corresponding reception ports.

The input patch 122 of the mixer M1 supplies according to the correspondence set by the user one of the plural waveform data outputted from the plural reception ports and the plural waveform data outputted from the plural input ports 121*a* to each of the plural input channels provided in the input channel module 123.

The input channel module 123 is a signal processor having plural input channels, and performs various signal processings to the inputted audio signals in the respective input channels.

Figure 8:
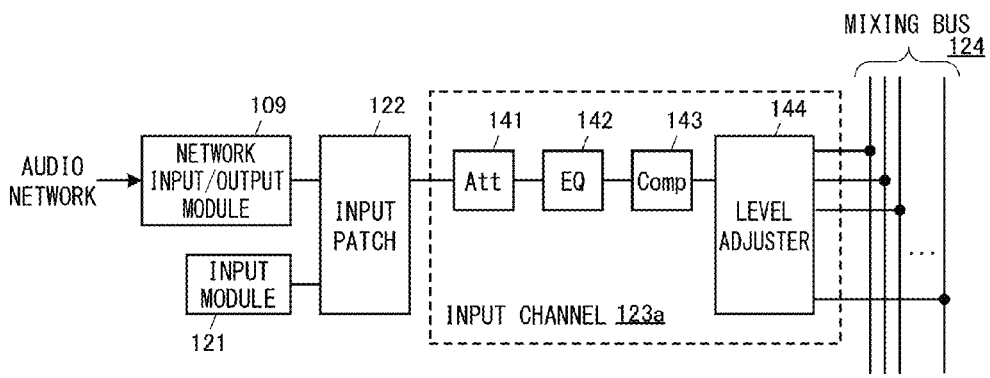
FIG. 8 is a diagram illustrating a structure of input channels which the mixer has.

FIG. 8 illustrates a structure of this input channel. FIG. 8 illustrates the structure of upstream side of the mixing bus 124 of the signal processor in the mixer.

An input channel 123*a* includes an attenuator (Att) 141, an equalizer (EQ) 142, a compressor (Comp) 143, and a level adjuster 144 as illustrated in FIG. 8.

Among them, the attenuator 141 attenuates an input signal. The equalizer performs adjustment of frequency characteristics. The compressor 143 performs level adjustment to compress dynamic range of a signal. The level adjuster 144 performs level adjustment for each output destination when an output of the compressor 143 is outputted to each system of the mixing bus 124.

Note that an input to the input channel 123*a* is one of waveform data correlated by the input patch 122 with the input channel 123*a* among an arbitrary number of waveform data obtained by the network input/output module 109 from the audio network and waveform data supplied from each input port 121*a* of the input module 121.

Further, in each system of the mixing bus 124, all the signals supplied from the plural input channels 123*a* to this system are added up and outputted to the output channel corresponding to this system in the output channel module 125.

Also in this output channel, various signal processings can be performed on inputted waveform data by signal processing elements such as an attenuator (Att), an equalizer (EQ), a compressor (Comp), and so on.

Referring back to FIG. 5, waveform data outputted by each output channel of the output channel module 125 are supplied to the output patch 126. Then, according to the correspondence set by the user, the output patch 126 supplies one of plural waveform data outputted from the plural output channels to plural transmission ports of the network input/output module 109 and each of the plural output ports provided in the output module 127.

The output module 127 is a part responsible for output of signal in the external input/output module 107 illustrated in FIG. 2, and includes plural analog output ports performing output of analog audio signals as well as plural digital output ports performing output of digital audio signals.

Further, waveform data transmitted by the mixer M1 to the audio network are read and outputted to the outside by the input/output device IO. A patch 223 and an output module 224 participate in this output.

The output module 224 among them is a part responsible for output of signal in the external input/output module 205 illustrated in FIG. 3, and includes plural output ports performing output of analog audio signals to the outside and plural digital output ports performing output of digital audio signals.

When plural signal transmission channels are set by the CPU 201 of the input/output device IO as reception channels to the network input/output module 206, plural reception ports are formed corresponding to the plural reception channels in the network input/output module 206, and plural waveform data received by the set reception channels are outputted respectively to the patch 223 from the plural reception ports corresponding to the plural reception channels.

The patch 223 supplies one of the plural waveform data outputted from the plural reception ports to each of the plural output ports of the output module 224 according to the correspondence set by the user.

As described above, in the input/output device IO of FIG. 3, the input module 221 and the output module 224 are embodied as the external input/output module 205, the patch 222 and the patch 223 are embodied as a waveform transmission function by the audio bus 212, and wires between the patch 222 and the patch 223 and the audio network are embodied as the network input/output module 206.

One characteristic point in the audio network system S as above is the function related to settings of gain of level adjustment and automatic compensation in the input ports 121*a* and 221*a* and display of these setting states. Accordingly, these points will be described below.

Figure 9:
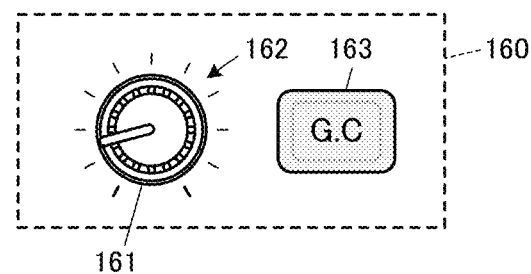
FIG. 9 is a diagram illustrating a structure of an input level control unit.

First, FIG. 9 illustrates a structure of an input level control unit for accepting a setting operation of gain and automatic compensation in the input port.

In the audio network system S, plural input level control units 160, one of which is illustrated in FIG. 9, are provided on a control panel of the mixer M. This input level control unit 160 is a displayed part displayed on a display of a touch panel, and includes a gain knob 161, a gain display section 162, and a compensation button 163.

Among them, the gain knob 161 is a gain operation acceptor for accepting a setting operation of analog gain values of the analog amplifiers 131 and 231.

The gain display section 162 is provided in the vicinity of a gain knob 161 and is a display displaying a target gain which is a target value of gain related to automatic compensation when the automatic compensation function is on with a mark 162*a* (see FIG. 14) and a scale. Further, the scale corresponds also to an indicator 161*a* of the gain knob 161, and can also display a current value of the analog gain value set by the operation of the gain knob 161 by the position of the indicator 161*a*.

The compensation button 163 is a compensation operation acceptor for accepting on/off operation of the automatic compensation function by a toggle.

Note that an operation to the gain knob 161 and the compensation button 163 can be performed by a dragging operation or a touch operation to the touch panel. However, it is conceivable that the functions of the gain knob 161 and the compensation button 163 are assigned to controls such as a physical rotary encoder or button, and an operation to these controls are handled as an operation to the gain knob 161 and the compensation button 163.

The above input level control unit 160 is correlated with the input port 121*a* which the mixer M itself includes or either of the input ports 121*a* or 221*a* which another mixer M or the input/output device IO includes, and functions as an operation acceptor for accepting setting of an analog gain value and automatic compensation on/off related to the input port. The correlation between the input level control unit 160 and the input port may be fixed, but may preferably be changeable by an operation of the user.

Figure 10:
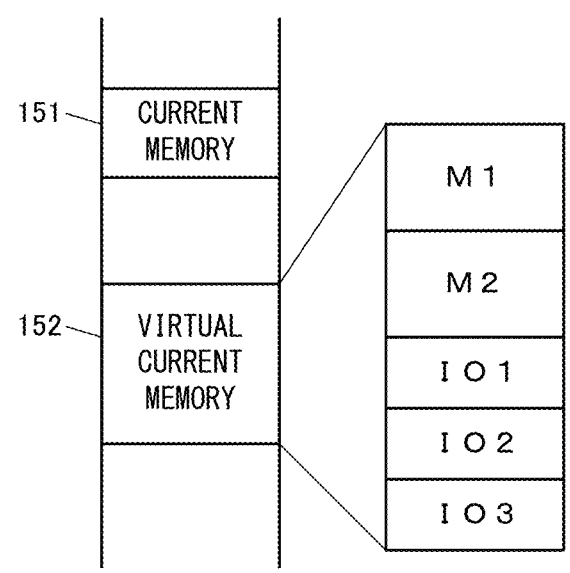
FIG. 10 is a diagram illustrating a structure of storage areas of parameters in the mixer.

Next, FIG. 10 illustrates a structure of storage areas of parameters in the mixer M.

The mixer M is provided with storage areas which are a current memory 151 and a virtual current memory 152 on the RAM 103 as illustrated in FIG. 10.

Among them, the current memory 151 is an area storing the current value of a parameter which the mixer M reflects on its operation. This parameter includes an analog gain value and automatic compensation function on/off in the input port 121*a*, and also includes a correspondence between waveform data and the input channel 123*a* at an input patch 122 and a parameter used for signal processing in each input channel 123*a*.

On the other hand, the virtual current memory 152 is an area storing the current value used for display of setting operation acceptance of parameter, in which, not only one for the mixer M itself, areas storing parameters related to all the devices which can be operated from the mixer M are prepared. The storage area related to each device has the same data structure as the current memory of this device and stores the same parameters.

Then, when the mixer M accepts a parameter change operation with a control such as the input level control unit 160, first a value of a parameter in this virtual current memory 152 is changed, and display of the current value is changed as necessary according to the value after the change. Thereafter, a change of value in the virtual current memory 152 is quickly reflected on the current memory 151, and at this point the change in value of the parameter is reflected on the signal processing. When a parameter of a device other than the mixer M is changed, a change is instructed to this device via the audio network, so as to reflect the change of the value of the parameter on a signal processing.

Further, the device which changed value of a parameter of the current memory (including the mixer M itself) notifies the value after the change to each device in the audio network system S, and likewise changes the value of the corresponding parameter of the virtual current memory. This enables to unify data of the virtual current memories in all the devices in the audio network system S. Therefore, when parameters can be edited in plural devices, for example the mixer M1 and mixer M2, a change made in one device can be shared quickly among all the devices, and values of the parameters can be edited without contradiction.

Next, processings executed by each device of the audio network system S according to an operation of the input level control unit 160 will be described.

Figure 11:
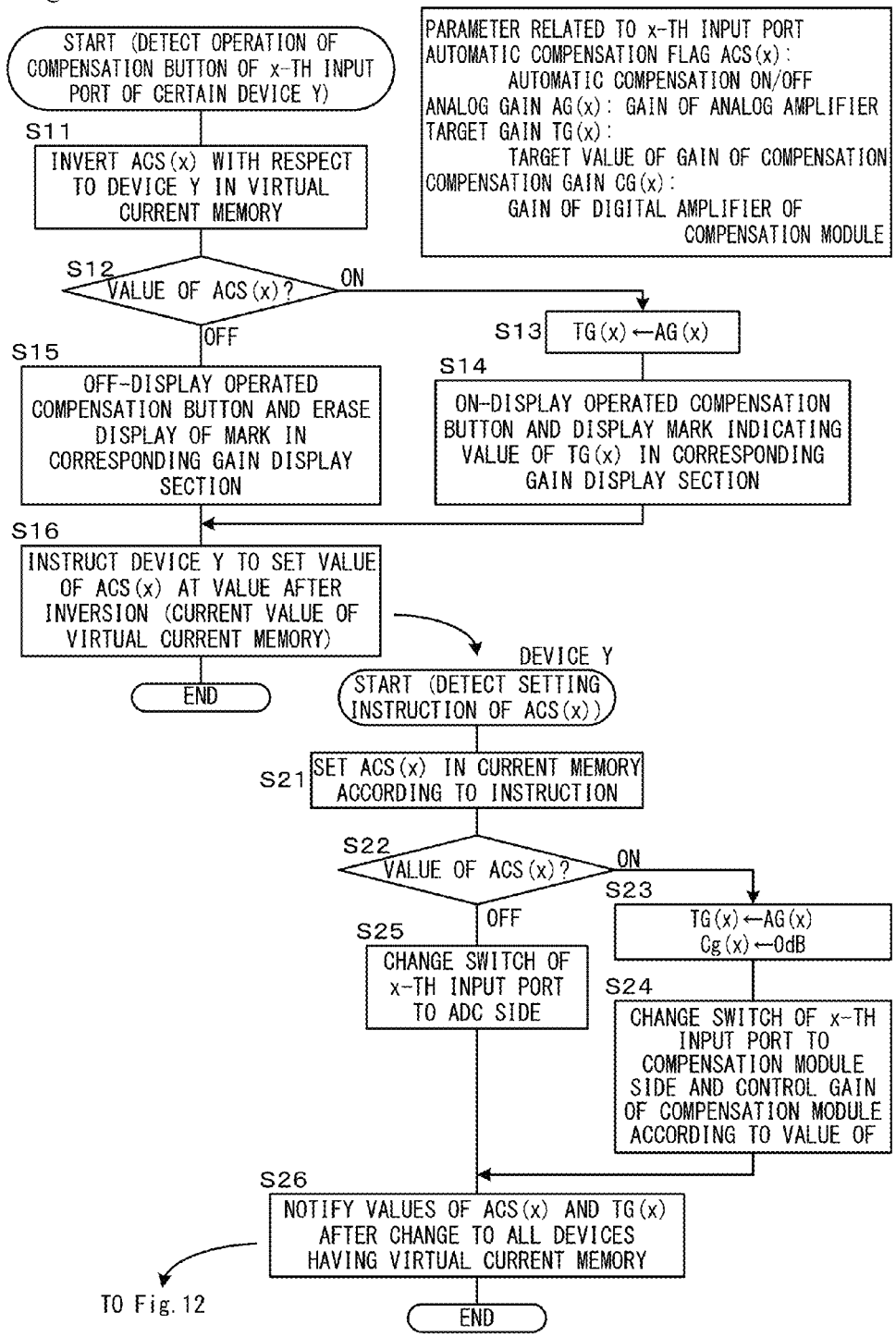
FIG. 11 is a flowchart of a processing executed when a CPU of the mixer illustrated in FIG. 1 detects an operation of a compensation button and another processing whose execution is triggered by this processing.
Figure 12:
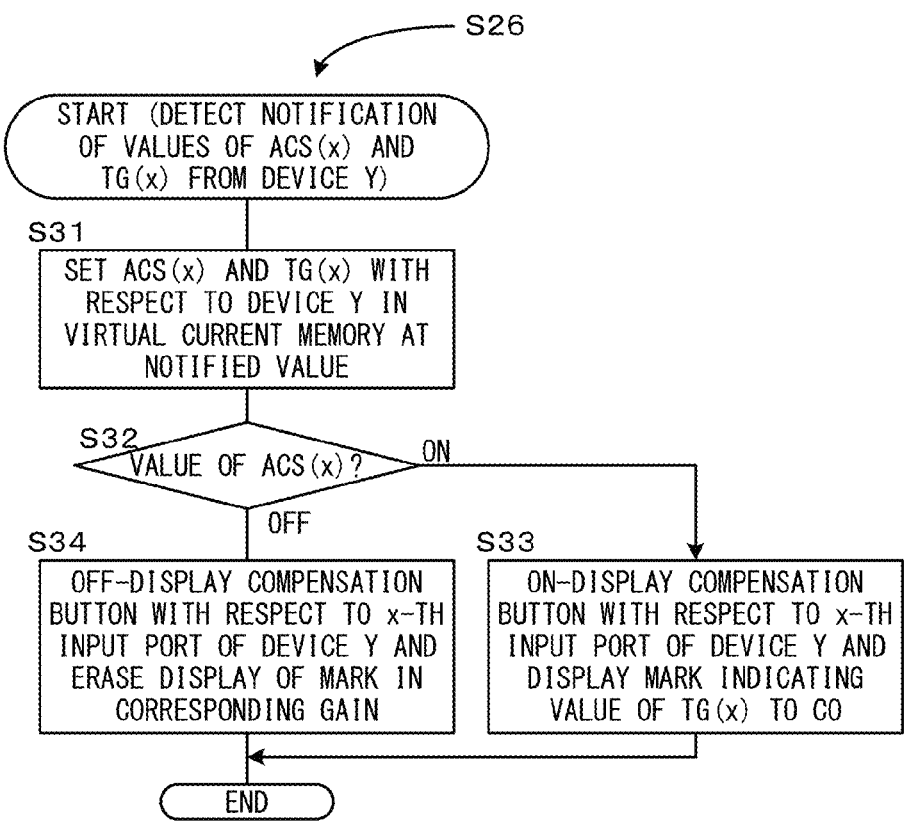
FIG. 12 is a flowchart continued from FIG. 11.

First, FIG. 11 and FIG. 12 illustrate flowcharts of processing when the CPU 101 of the mixer M detects an operation of the compensation button 163.

When the CPU 101 of the mixer M detects an operation of the compensation button 163 corresponding to the x-th input port of a certain device Y, it starts a processing described in the upper left flowchart of FIG. 11.

In this processing, the CPU 101 first inverts an automatic compensation flag ACS(x) for the device Y in the virtual current memory 152 (S11). ACS(x) is a flag illustrating automatic compensation on/off of the x-th input port.

Then, when the value of ACS(x) after it is inverted is ON (S12), as a processing corresponding to start of the automatic compensation function, the CPU 101 set a value of target gain TG(x) which is a target value of gain during automatic compensation at the value of the analog gain AG(x) which is a current value of gain of the analog amplifier 131 (S13). Thereafter, the CPU 101 changes the operated compensation button 163 to on display, and displays the mark 162*a* indicating the value of TG(x) (see FIG. 14) on the corresponding gain display section 162 (S14).

On the other hand, when the value of ACS(x) after it is inverted is OFF in step S12, the CPU 101 changes the operated compensation button 163 to off display and erase display of the mark 162*a* in the corresponding gain display section 162, as a processing corresponding to end of the automatic compensation (S15).

Then, in either case, the CPU 101 instructs the device Y to set value of ACS(x) at the value after the inversion (value of the virtual current memory) (S16), and the processing finishes. This instruction can be performed by transmitting a command including the identifier and the current value of ACS(x) to the device Y via the audio network. Further, when the device Y is the mixer M itself, transmission of command is unnecessary, but the processing corresponding to the instruction is executed similarly to another device.

On the other hand, when the CPU (here the CPU 201 of the input/output device IO) of each device constituting the audio network system S detects a setting instruction of ACS(x) transmitted to the device in step S16, the CPU starts a processing illustrated in the lower right flowchart of FIG. 11.

In this processing, the CPU 201 first sets the parameter ACS(x) in the current memory indicated by the identifier included in the instruction at the same value as the current value included in the instruction (S21).

Then, when the value of ACS(x) after it is set is ON (S22), the CPU 201 sets value of the target gain TG(x) at the value of the analog gain AG(x), and sets a value of compensation gain CG(x) which is gain of the compensation module 234 to 0 dB (S23), so as to start the automatic compensation. Then, the CPU 201 switches the switch 235 of the x-th input port 221*a* to the compensation module 234 side, and gain of the compensation module 234 is controlled according to the value of CG(x) (S24).

On the other hand, when the value of ACS(x) is OFF in step S22, the CPU 201 switches the switch 235 of the x-th input port 221*a* to the ADC 233 side to stop the automatic compensation (S25). The value of AG(x) is not changed, and thus waveform data outputted thereafter from the input port 221*a* are ones level adjusted according to the value of AG(x) at the point of switching.

Then, in either case, the CPU 201 notifies each device (here, the mixer engines M1, M2) having a virtual current memory in the audio network system S of the values of ACS(x) and TG(x) after they are changed (S26), and the processing is finished. This notification can be performed by transmitting a message including respective identifiers and current values of ACS(x) and TG(x) to each device via the audio network.

Note that to which device the notification of step S26 should be performed (which device has the virtual current memory with respect to the device Y) is manually set in advance, or is automatically set by collecting necessary information when activating the device Y and connecting to the audio network. Further, it is not always necessary to perform the notification of step S26 to the transmission source of setting instruction of ACS(x).

Further, since the value of the CG(x) is neither directly operated and set by the user nor used for display, the value need not necessarily be unified with the virtual current memory and thus is not notified here, but the value of CG(x) may also be notified so as to unify the value.

Then, the CPU (here, the CPU 101 of the mixer M) of each device constituting the audio network system S starts the processing illustrated in the flowchart of FIG. 12 when it detects the notification transmitted to the device in step S26 from the device Y.

In this processing, the CPU 101 first sets the ACS(x) and TG(x) for the device Y which is the transmission source of the notification in the virtual current memory 152 at the notified value (S31).

Then, when the value of ACS(x) is ON after the setting (S32), the CPU 101 changes the compensation button 163 for the x-th input port of the device Y to on display, and displays the mark 162*a* (see FIG. 14) indicating the value of TG(x) after it is set on the corresponding gain display section 162 (S33), and then the processing is finished.

On the other hand, when the value of ACS(x) after it is inverted is OFF in step S32, the CPU 101 changes the compensation button 163 with respect to the x-th input port of the device Y to off display, and erases display of mark 162*a* in the corresponding gain display section 162 is erased (S34), and the processing is finished.

By the above series of processings, according to an operation to turn on the automatic compensation function, the automatic compensation in the input port x is started in the device Y, and the target value of gain at the time of automatic compensation can also be displayed on the gain display section 162 used also for display of an analog gain value. Further, according to an operation to turn off the automatic compensation function, automatic compensation in the input port x in the device Y can be stopped, and display of target value can also be erased.

Note that in step S16, regarding TG(x), a value to be set itself is not notified and a value of AG(x) is referred on the device Y side to set the value, but a concrete value may be specified and setting may be instructed also for TG(x) in step S16.

Figure 13:
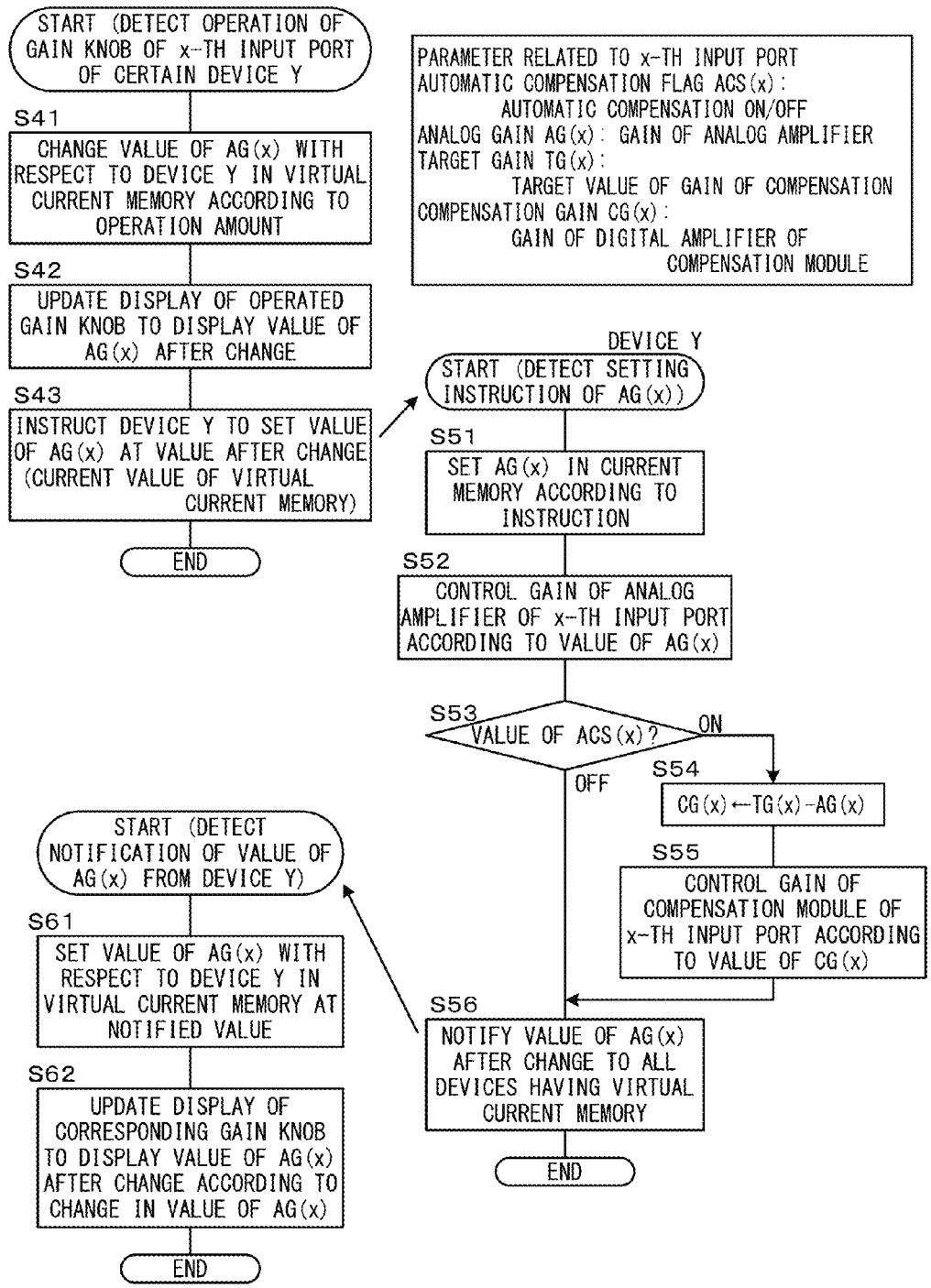
FIG. 13 is a flowchart of a processing executed when a CPU of the mixer illustrated in FIG. 1 detects an operation of a gain knob and another processing whose execution is triggered by this processing.

Next, FIG. 13 illustrates a flowchart of processing when the CPU 101 of the mixer M detects an operation of the gain knob.

When the CPU 101 of the mixer M detects an operation of the gain knob 161 corresponding to the x-th input port of a certain device Y, it starts the processing described in the upper left flowchart of FIG. 13.

In this processing, the CPU 101 first changes value of analog gain AG(x) with respect to the device Y in the virtual current memory 152 according to the detected operation amount (S41).

Then, the CPU 101 updates display of the operated gain knob 161 to display the value of AG(x) after it is changed (S42). Thereafter, the CPU 101 instructs the device Y to set the value of AG(x) at the value after the change (value of the virtual current memory) similarly to the case of step S16 of FIG. 11 (S43), and the processing is finished. This instruction is performed by transmitting a command including the identifier of AG(x) and the current value thereof to the device Y via the audio network.

On the other hand, when the CPU (here the CPU 201 of the input/output device IO) of each device constituting the audio network system S detects the setting instruction of AG(x) transmitted to the device in step S43, it starts the processing described in the right flowchart of FIG. 13.

In this processing, the CPU 201 first sets the parameter AG(x) in the current memory indicated by an identifier included in the instruction at the same value as the current value included in the instruction (S51). Then, the CPU 201 controls gain of the analog amplifier 231 of the x-th input port 221a according to the value of AG(x) after the change (S52).

Thereafter, when the value of ACS(x) is ON (S53), in order to execute processing related to the automatic compensation, the CPU 201 sets value of compensation gain CG(x) at a difference between the target gain TG(x) and value of analog gain AG(x) after the change (S54), and controls gain of the compensation module 234 of the x-th input port 221a according to the value of CG(x) after the change (S55).

Thereafter, the CPU notifies the value of AG(x) after the change, similarly to step S26 of FIG. 11, to all the devices (here the mixer engines M1, M2) having the virtual current memory in the audio network system S (S56), and the processing is finished. This notification can be performed by transmitting a message including the identifier and the current value of AG(x) to each device via the audio network.

When the value of ACS(x) is OFF in step S53, the process proceeds to step S56 without any change.

Then, when the CPU (here, the CPU 101 of the mixer M) of each device constituting the audio network system S detects the notification transmitted to the device from the device Y in step S53, it starts the processing described in the lower left flowchart of FIG. 13.

In this processing, the CPU 101 first sets the AG(x) with respect to the device Y in the virtual current memory 152 at the notified value (S61). Then, the CPU 101 updates display of gain knob 161 corresponding to the changed AG(x) so that value of AG(x) after the change is displayed (S62), and the processing is finished.

When the automatic compensation function is on, by the above series of processing, gain of the compensation module 234 can be set to a value which cancels out the difference between the target value and current value of the analog gain. Further, irrespective of on/off of the automatic compensation function, current value of the analog gain can be displayed on the gain display section 162.

Figure 14:
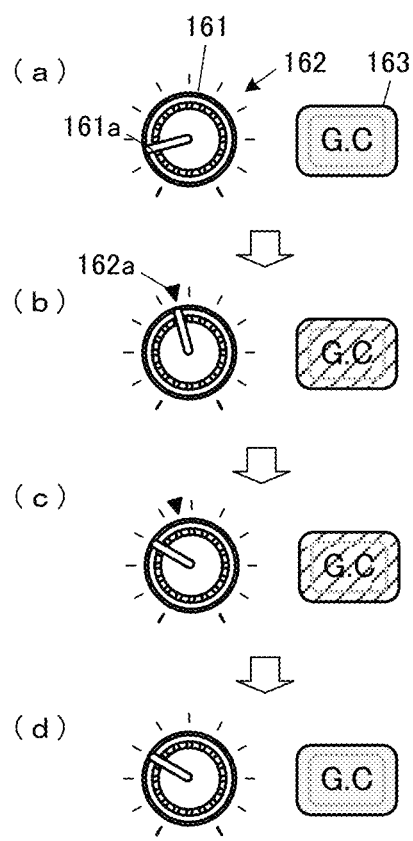
FIG. 14 is a diagram illustrating a transition example of display in the input level control unit.

Next, FIG. 14 illustrates a transition example of display in the input level control unit 160 performed by the processing of FIG. 11 to FIG. 13.

Illustrated in (a) of FIG. 14 is a state that the automatic compensation function is off. When the gain knob 161 is rotated in this state, the analog gain value in the input port changes accordingly, which is also reflected on actual gain. Further, current value of the analog gain is displayed by the indicator 161a.

Then, when the knob is rotated to an arbitrary position and the compensation button 163 is pressed down, it becomes a state illustrated in (b). The compensation button 163 becomes a lighting-on state indicating that the automatic compensation function is on, and on the gain display section 162, current value of the analog gain at this point is displayed as a target gain by the mark 162a.

When the gain knob 161 is rotated in a state where the automatic compensation function is on, the analog gain value changes accordingly, and as illustrated in (c), also the indicator 161a moves to a position indicating current value of the analog gain but of course the target gain does not change. The effective gain of the input port remains to be the value of the target gain.

Thereafter, when the compensation button 163 is pressed down again, it returns to the state that the automatic compensation function is off. Then, as illustrated in (d), the compensation button 163 becomes a lighting-off state indicating that the automatic compensation function is off, and the mark 162a indicating the target gain is erased.

As illustrated above, when the automatic compensation function is on, the audio network system S displays the target gain of automatic compensation in the vicinity of the gain knob 161 accepting setting of analog gain of the input port as in (b) and (c). Therefore, by just looking at display of the gain knob 161, on/off of the automatic compensation function and the effective gain (target gain) of the input port when it is on can be confirmed. Of course, it is also possible to confirm gain value of the analog amplifier irrespective of on/off of the automatic compensation function. Therefore, the automatic compensation function can be utilized in a state that allows the user to easily comprehend level of a signal to be outputted from the input port to the subsequent stage. That is, while comprehending the effective gain of the input port, value of analog gain can be adjusted to a preferred value for analog-digital conversion.

Figure 15:
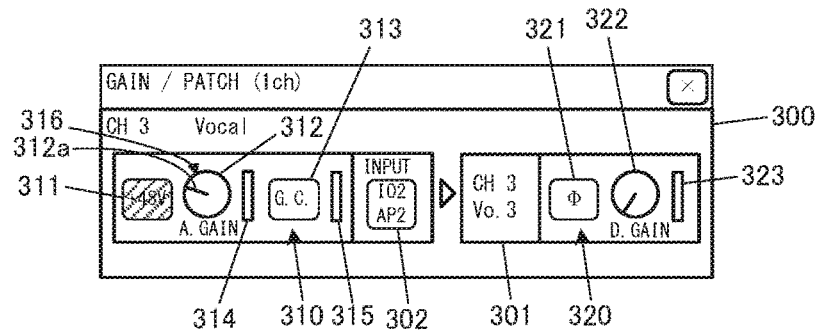
FIG. 15 is a diagram illustrating a display example of a gain/patch setting screen.
Figure 16:
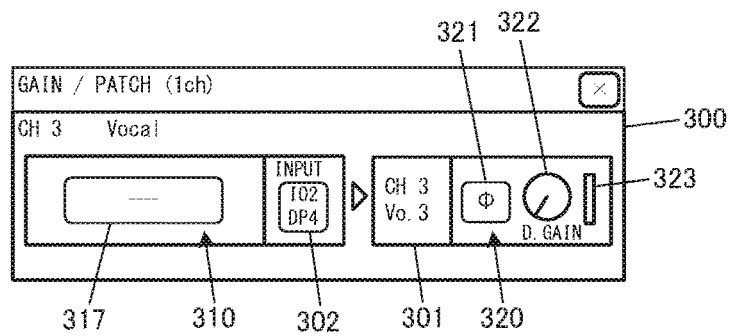
FIG. 16 is an example illustrating another example thereof.
Figure 17:
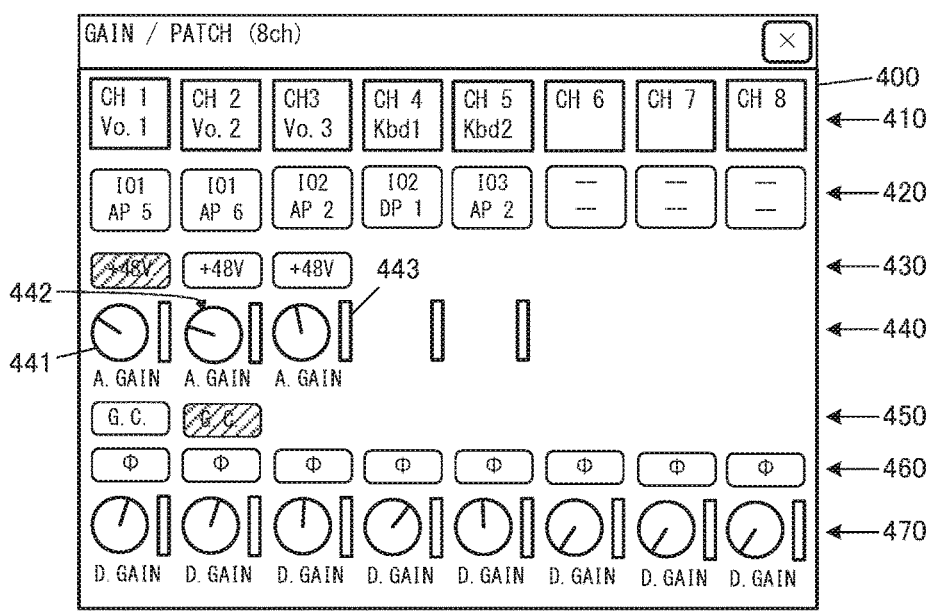
FIG. 17 is an example illustrating still another example thereof.

Next, FIG. 15 to FIG. 17 illustrate other display examples of the control unit related to gain adjustment of an input port. In the display examples illustrated in these diagrams, other controls besides the controls equivalent to the gain knob 161 and the compensation button 163 are collected in one combined control unit.

Illustrated in FIG. 15 and FIG. 16 are display examples of a gain/patch setting screen.

This gain/patch setting screen 300 is a screen accepting setting related to signal transmission from an external input of audio signal to the input channel 123 of the mixer M which processes this signal. More specifically, it is a screen accepting, with respect to one input channel 123a of the input channel module 123 of the mixer M, setting related to gain adjustment in the input port together with setting about an audio signal inputted from which input port of which device is to be supplied.

When the user selects one input channel to instruct display of the gain/patch setting screen on a not illustrated screen, the gain/patch setting screen 300 is pop-up displayed, and information of the channel is displayed in an input channel display portion 301.

Further, by touching an input port selecting section 302, it is possible to make a selection regarding from which input port an inputted audio signal is supplied to the input channel displayed on the input channel display portion 301 by a not-illustrated pop-up screen. Options are all the input ports of all the devices (including the mixer M itself) constituting the audio network system S as long as it is particularly limited separately.

When the input port 121a of the mixer M itself is selected, the input port 121a and the input channel 123a are correlated in the input patch 122 according to this selection.

Further, when the input port 221a of the input/output device IO is selected, according to this selection, a wire via the patch 222, the audio network, and the patch 122 for supplying an audio signal from its input port 121a to its input channel 123a is set automatically.

Describing more specifically, in this input/output device IO, one of secured signal transmission channels is assigned to the wire, and in the patch 222, setting to supply an output of the input port 121a to the transmission port corresponding to this assigned signal transmission channel is performed. Further, in the mixer M, a corresponding reception port is prepared by a reception setting of the signal transmission channel, and in the input patch 122, setting to supply an output of this reception port to the input channel 123*a* is performed.

Then, FIG. 15 illustrates an example of the case where an analog input port AP2 of the input/output device IO2 is selected in an input port selecting section 302.

In this case, an input port setting section 310 is provided with a phantom power supply setting button 311, a gain knob 312, a compensation button 313, and level meters 314, 315.

The phantom power supply setting button 311 is a button for setting on/off of phantom power supply supplied to the analog amplifier 231 (or 131) which is a head amplifier provided at the input port.

The gain knob 312 and the compensation button 313 correspond to the gain knob 161 and the compensation button 163 illustrated in FIG. 9. Of course, the gain knob 312 includes an indicator 312*a* displaying the current value of analog gain, and a mark 316 indicating target gain of the automatic compensation can be displayed in the vicinity of the gain knob 312.

The level meter 314 displays level of a signal after it is adjusted in level by the analog amplifier 231 (or 131) and before analog-digital conversion, and is used for reference to analog gain value setting. The level meter 315 displays level of a signal to be transmitted to the audio network selected by the switch 235 (or 135).

On the other hand, an input channel setting section 320 is provided with a phase button 321, a digital gain knob 322, and a level meter 323.

The phase button 321 is a button for inverting whether to perform/not perform phase inversion of a not-illustrated phase inverting module which is located in the attenuator 141 provided in the input channel 123*a*. The digital gain knob 322 is a knob for adjusting gain (or attenuation factor) of the digital signal in the attenuator 141. The level meter 323 displays level of a signal between the attenuator 141 and the equalizer 142 in the input channel 123*a*.

On the other hand, illustrated in FIG. 16 is an example of the case where a digital input port DP4 of the input/output device IO2 is selected in the input port selecting section 302.

In this case, the structure of the input port setting section 310 is different from the case of FIG. 15, and the input port setting section 310 only has a name display portion 317 displaying name of a destination of connection and a level meter 315 corresponding to FIG. 15.

This is because the head amplifier is not provided in the digital input port and thus setting related to this is not necessary.

Illustrated in FIG. 17 is an example of a screen in which screens illustrated in FIG. 15 and FIG. 16 of plural channels are collected.

A gain/patch setting screen 400 illustrated in FIG. 17 is provided with an input channel selecting section 410, an input port selecting section 420, a phantom power supply setting section 430, an analog gain setting section 440, an automatic compensation setting section 450, a phase setting section 460, and a digital gain setting section 470.

In these sections, control units and display portions corresponding to those described in FIG. 15 are provided for each input channel of eight channels. However, no control units are provided for the channel to which an input port which does not have a relevant function is correlated.

The input channel selecting section 410 corresponds to the input channel display portion 301 of FIG. 15. The input port selecting section 420 corresponds to the input port selecting section 302 of FIG. 15.

The phantom power supply setting section 430 corresponds to the phantom power supply setting button 311 of FIG. 15. However, regarding an input channel which is not correlated with the input port (the case of CH 6 to CH 8) or correlated with an input port (here, the digital input port) having no phantom power supply (the case of CH 4 and CH 5), the setting related to the phantom power supply has no meaning, and thus the button itself is not provided.

The analog gain setting section 440 is a section having parts of a gain knob 441 and a level meter 443 respectively corresponding to the gain knob 312 and the level meter 314 of FIG. 15. In the vicinity of the gain knob 441, a mark 442 (corresponding to the mark 316 of FIG. 15) illustrating target gain of the automatic compensation can also be displayed. Note that the level meter 314 is not provided for the input channel not correlated with the input port because there are no data to be displayed. In addition, the gain knob 441 is not provided for the input channel correlated to the input port having no head amplifier (here the digital input port) because there is no parameter to be set and displayed.

The automatic compensation setting section 450 corresponds to the compensation button 313 of FIG. 15. However, the compensation button is provided only for the input channel correlated to the analog input port having the automatic compensation function. In the example of FIG. 17, the input port correlated with the input channel of CH 3 is an analog input port which does not have the automatic compensation function, and thus this compensation button is not provided (therefore, the mark 442 is not displayed in the analog gain setting section 440).

The phase setting section 460 corresponds to the phase button 321 of FIG. 15. The digital gain setting section 470 is a section having parts corresponding to the digital gain knob 322 and the level meter 323 of FIG. 15.

In the audio network system S, the mixer M can display analog gain values and target gain of the automatic compensation in the input ports 121*a*, 221*a* in a form that they can be easily seen and that allows easy understanding of mutual relation, similarly to the case of the input level control unit 160 illustrated in FIG. 9, also by the screen described using above FIG. 15 to FIG. 17.

Note that when constraints on space of screens are stricter, such as displaying parameters of much more channels, for example, all the channels in one screen, the display of the compensation button 313 can also be omitted. Also in this case, the user can comprehend the automatic compensation is performed in which input port corresponding to which input channel, by presence of the mark 442.

The description of the embodiment is finished here, but of course structures of the system and devices, structure of the control panel, concrete processing steps, control methods, and so on are not limited to those described in the above-described embodiment.

In the above-described embodiment, an example of providing the input level control units 160 on the screen displayed on the display has been described. However, instead of this, physical controls corresponding to the gain knob 161 and the compensation button 163 may be used. In this case, as the gain display section 162, indicators constituted of plural LEDs may be provided along an operable range of the gain knob 161.

Further, the gain knob 161 is not limited to a rotatable knob, and may be of a different shape such as a slider movable in a straight direction. The compensation button 163 is not limited to the push button, and may be an on/off switch of lever type or seesaw type.

Further, as the target gain of the automatic compensation, it is preferred to use an analog gain value at a point when the automatic compensation function is turned on, but it is not restrictive.

Further, in the above-described embodiment, an example in which the audio signal processing system is constituted of a mixer (signal processing device) and an input/output device which are connected such that an audio signal can be transmitted by the audio network has been described. However, it is not restrictive. The input port having the automatic compensation function, the signal supply destination (the input channel in the above-described embodiment but it is not restrictive) from the input port, the UI accepting and displaying an operation related to the input port, and the controller executing setting related to the input port may all be provided in the same device. That is, one device may constitute the audio network system. In the above-described embodiment, the mixer M is a device having all of these components.

Further, conversely, in the above-described embodiment, the UI and the controller are provided in the mixer M having the input channel and the input port, but the UI may be independent and provided as a dedicated control device for controlling the signal processing device and the input/output device. In this case, the control device need not necessarily be connected to the audio network, and may be connected to one of devices connected to the audio network via another interface such as the USB (Universal Serial Bus), the IEEE (Instituted of Electrical and Electronics Engineers) 1394, or the like. Further, as the hardware of the control device, a publicly known PC may be used as long as an operation is performed on a GUI (Graphical User Interface). Of course, a dedicated remote controller having numerous physical controls for operating an audio apparatus may also be used.

Including these points, when an audio network system is constituted of plural devices, it would not be a problem if the functions of the input ports, the signal supply destination, the UI, and the controller described in the embodiment may be provided in any combination in each of the devices. Also in this case, by making the devices to carry out appropriate communication to let them cooperate, the function of gain adjustment in the input port including the automatic compensation and the function of easy-to-see display of the operating state thereof can be executed similarly to the case of the above-described embodiment.

Moreover, it is not necessary to perform the communication between the plural devices via the ring-type audio network as described above, and it is of course possible to perform it by using other protocols.

Further, the structures and modification examples as have been described above may be applied in an appropriate combination within the range without contradiction.

INDUSTRIAL APPLICABILITY

As is clear from the above description, the invention can make it easy for a user to comprehend level of a signal outputted to a subsequent stage from an input port in an audio signal processing system having an automatic compensation function.

Therefore, by applying the invention, an operability related to the automatic compensation function can be improved.

REFERENCE SIGNS LIST

CB . . . communication cable, IO1 to IO3 . . . input/output device, M1, M2 . . . mixer, S . . . audio network system, 101, 201 . . . CPU, 102, 202 . . . ROM, 103, 203 . . . RAM, 104 . . . display, 105 . . . moving fader, 106 . . . controls, 107, 205 . . . external input/output module, 108 . . . DSP, 109, 206 . . . network input/output module, 111, 211 . . . system bus, 112, 212 . . . audio bus, 121, 221 . . . input module, 121*a*, 221*a* . . . input port, 122 . . . input patch, 123 . . . input channel module, 123*a* . . . input channel, 124 . . . mixing bus, 125 . . . output channel, 126 . . . output patch, 127 . . . output module, 131, 231 . . . analog amplifier, 132, 232 . . . gain adjusting module, 133, 233 . . . ADC, 134, 234 . . . compensation module, 135, 235 . . . switch, 141 . . . attenuator, 142 . . . equalizer, 143 . . . compressor, 144 . . . level adjuster, 151 . . . current memory, 152 . . . virtual current memory, 160 . . . input level control unit, 161 . . . gain knob, 161*a* . . . indicator, 162 . . . gain display section, 162*a* . . . mark, 163 . . . compensation button, 204 . . . simple UI, 222, 223 . . . patch, 224 . . . output module

The invention claimed is:

1. An audio signal processing system, comprising in one device or in a distributed manner in plural devices:
    a level adjuster including:
        an analog amplifier for adjusting a level of an inputted analog signal according to a set analog gain value,
        an AD converter for converting an analog signal outputted from the analog amplifier into a digital signal,
        a digital amplifier for adjusting a level of a digital signal outputted by the AD converter according to a set digital gain value, and
        a selector for selecting one of an output of the AD converter and an output of the digital amplifier as a signal to be outputted from the level adjuster to a subsequent stage;
    a gain operation acceptor for accepting a change operation of the analog gain value;
    a compensation operation acceptor for accepting an on/off operation of automatic compensation in the level adjuster;
    an analog gain display for displaying a current value of the analog gain value; and
    a controller for:
        (1) according to an on/off operation to turn on the automatic compensation at a point in time, displaying a current value of the analog gain value at this point as a target gain value in a vicinity of the analog gain display and causing the selector to select the output of the digital amplifier,
        (2) according to the change operation of the analog gain value while the automatic compensation is turned on, setting the digital gain value to a value which cancels out a difference between the target gain value and the analog gain value, and
        (3) according to an on/off operation to turn off the automatic compensation, erasing the display of the target gain value and causing the selector to select the output of the AD converter.

2. The audio signal processing system according to claim 1, wherein an audio mixer, as the one device or one of the plural devices, comprises:
    the level adjuster,
    an input channel as the subsequent stage, and
    an input patch for supplying the signal to be outputted from the level adjuster to the input channel according to correspondence set by a user.

3. The audio signal processing system according to claim 1, comprising an input/output device and an audio mixer as two of the plural devices, both the input/output device and the audio mixer connected to an audio network, wherein the input/output device comprises the level adjuster and is configured to transmit the signal to be outputted from the level adjuster via the audio network, and the audio mixer is configured to receive and process the transmitted signal.

4. The audio signal processing system according to claim 1,
   wherein the gain operation acceptor is a gain knob for accepting the change operation of the analog gain value,
   wherein the controller is configured to display the target gain value with a mark in the vicinity of the gain knob, and
   wherein the analog gain display is configured to display the current value of the analog gain with an indicator of the gain knob.

5. The audio signal processing system according to claim 4,
   wherein the controller is configured to display the target gain value with the mark and a scale corresponding to the indicator of the gain knob.

6. The audio signal processing system according to claim 4, comprising:
   an input channel of an audio mixer;
   a plurality of input ports;
   an input port selecting section for selecting an input port of the plurality of input ports, the selected input port for supplying an input audio signal to the input channel of the audio mixer; and
   a display, wherein:
     when the input port selecting section selects an input port having a head amplifier, the gain knob is displayed on a screen by the display, and
     when the input port selecting section selects an input port having no head amplifier, the gain knob is not displayed on the screen by the display.

7. The audio signal processing system according to claim 1,
   wherein the compensation operation acceptor is a compensation button for accepting the on/off operation of the automatic compensation.

8. The audio signal processing system according to claim 7, comprising:
   an input channel of an audio mixer;
   a plurality of input ports;
   an input port selecting section for selecting an input port of the plurality of input ports, the selected input port for supplying an input audio signal to the input channel of the audio mixer; and
   a display, wherein:
     when the input port selecting section selects an input port having an automatic compensation function, the compensation button is displayed on a screen by the display, and
     when the input port selecting section selects an input port not having an automatic compensation function, the compensation button is not displayed on the screen by the display.

9. The audio signal processing system according to claim 1,
   wherein the gain operation acceptor is a gain knob for accepting the change operation of the analog gain value and functionality of the gain knob is assigned to a physical rotary encoder, and
   wherein the compensation operation acceptor is a compensation button for accepting the on/off operation of the automatic compensation and functionality of the compensation button is assigned to a physical button.

10. A method for controlling a level adjuster comprising: an analog amplifier for adjusting a level of an inputted analog signal according to a set analog gain value, an AD converter for converting an analog signal outputted from the analog amplifier into a digital signal, a digital amplifier for adjusting a level of a digital signal outputted by the AD converter according to a set digital gain value, a selector for selecting one of an output of the AD converter and an output of the digital amplifier as a signal to be outputted from the level adjuster to a subsequent stage, and an analog gain display for displaying a current value of the analog gain value, the level adjuster in an audio signal processing system, which is configured to accept a change operation of the analog gain value and to accept an on/off operation of automatic compensation in the level adjuster,
   said method comprising:
     displaying, on the system accepting an on/off operation to turn on the automatic compensation at a point in time, a current value of the analog gain value at this point as a target gain value in a vicinity of the analog gain display and causing the selector to select the output of the digital amplifier;
     setting, on the system accepting the change operation of the analog gain value while the automatic compensation is turned on, the digital gain value to a value which cancels out a difference between the target gain value and the analog gain value; and
     erasing, on the system accepting an on/off operation to turn off the automatic compensation, the display of the target gain value and causing the selector to select the output of the AD converter.

11. An audio signal processing system, comprising in one device or in a distributed manner in plural devices:
   a first input port including:
     an analog amplifier for adjusting a level of an inputted analog signal according to a set analog gain value,
     an AD converter for converting an analog signal outputted from the analog amplifier into a digital signal,
     a digital amplifier for adjusting a level of a digital signal outputted by the AD converter according to a set digital gain value, and
     a switch for selecting one of an output of the AD converter and an output of the digital amplifier as a signal to be outputted from the first input port to a subsequent stage;
   a first user-operable control for accepting a change operation of the analog gain value;
   a second user-operable control for accepting an on/off operation of automatic compensation in the level adjuster;
   an analog gain display for displaying a current value of the analog gain value; and
   a processor for:
     (1) according to an on/off operation to turn on the automatic compensation at a point in time, displaying a current value of the analog gain value at this point as a target gain value in a vicinity of the analog gain display and causing the switch to select the output of the digital amplifier,
     (2) according to the change operation of the analog gain value while the automatic compensation is turned on, setting the digital gain value to a value which cancels out a difference between the target gain value and the analog gain value, and (3) according to an on/off operation to turn off the automatic compensation, erasing the display of the target gain value and causing the switch to select the output of the AD converter.

12. The audio signal processing system according to claim 11,
wherein an audio mixer, as the one device or one of the plural devices, comprises:
the first input port,
an input channel as the subsequent stage, and
an input patch for supplying the signal to be outputted from the first input port to the input channel according to correspondence set by a user.

13. The audio signal processing system according to claim 11, comprising an input/output device and an audio mixer as two of the plural devices, both the input/output device and the audio mixer connected to an audio network,
wherein the input/output device comprises the first input port and is configured to transmit the signal to be outputted from the first input port via the audio network, and the audio mixer is configured to receive and process the transmitted signal.

14. The audio signal processing system according to claim 11,
wherein the first user-operable control is a gain knob for accepting the change operation of the analog gain value,
wherein the processor is configured to display the target gain value with a mark in the vicinity of the gain knob, and
wherein the analog gain display is configured to display the current value of the analog gain with an indicator of the gain knob.

15. The audio signal processing system according to claim 14,
wherein the processor is configured to display the target gain value with the mark and a scale corresponding to the indicator of the gain knob.

16. The audio signal processing system according to claim 14, comprising:
an input channel of an audio mixer;
a plurality of input ports including the first input port;
a third user-operable control for selecting an input port of the plurality of input ports, the selected input port for supplying an input audio signal to the input channel of the audio mixer; and
a display, wherein:
when the third user-operable control selects an input port having a head amplifier, the gain knob is displayed on a screen by the display, and
when the third user-operable control selects an input port having no head amplifier, the gain knob is not displayed on the screen by the display.

17. The audio signal processing system according to claim 11,
wherein the second user-operable control is a compensation button for accepting the on/off operation of the automatic compensation.

18. The audio signal processing system according to claim 17, comprising:

an input channel of an audio mixer;
a plurality of input ports including the first input port;
a third user-operable control for selecting an input port of the plurality of input ports, the selected input port for supplying an input audio signal to the input channel of the audio mixer; and
a display, wherein:
when the third user-operable control selects an input port having an automatic compensation function, the compensation button is displayed on a screen by the display, and
when the third user-operable control selects an input port not having an automatic compensation function, the compensation button is not displayed on the screen by the display.

19. The audio signal processing system according to claim 11,
wherein the first user-operable control is a gain knob for accepting the change operation of the analog gain value and functionality of the gain knob is assigned to a physical rotary encoder, and
wherein the second user-operable control is a compensation button for accepting the on/off operation of the automatic compensation and functionality of the compensation button is assigned to a physical button.

20. A method for controlling an input port comprising: an analog amplifier for adjusting a level of an inputted analog signal according to a set analog gain value, an AD converter for converting an analog signal outputted from the analog amplifier into a digital signal, a digital amplifier for adjusting a level of a digital signal outputted by the AD converter according to a set digital gain value, a switch for selecting one of an output of the AD converter and an output of the digital amplifier as a signal to be outputted from the input port to a subsequent stage, and an analog gain display for displaying a current value of the analog gain value, the input port in an audio signal processing system, which comprises a first user-operable control for accepting a change operation of the analog gain value and a second user-operable control for accepting an on/off operation of automatic compensation in the input port,
said method comprising:
displaying, on the second user-operable control accepting an on/off operation to turn on the automatic compensation at a point in time, a current value of the analog gain value at this point as a target gain value in a vicinity of the analog gain display and causing the switch to select the output of the digital amplifier;
setting, on the first user-operable control accepting the change operation of the analog gain value while the automatic compensation is turned on, the digital gain value to a value which cancels out a difference between the target gain value and the analog gain value; and
erasing, on the second user-operable control accepting an on/off operation to turn off the automatic compensation, the display of the target gain value and causing the switch to select the output of the AD converter.

* * * * *